(12) United States Patent
Gotsick et al.

(10) Patent No.: US 10,216,086 B2
(45) Date of Patent: Feb. 26, 2019

(54) METHOD FOR CREATING SURFACE TEXTURE ON FLEXOGRAPHIC PRINTING ELEMENTS

(71) Applicant: MacDermid Graphics Solutions, LLC, Waterbury, CT (US)

(72) Inventors: Timothy Gotsick, Acworth, GA (US); Laurie A. Bryant, Douglasville, GA (US); David A. Recchia, Smyrna, GA (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 0 days.

(21) Appl. No.: 14/985,638

(22) Filed: Dec. 31, 2015

(65) Prior Publication Data

US 2016/0116844 A1   Apr. 28, 2016

Related U.S. Application Data

(62) Division of application No. 14/183,948, filed on Feb. 19, 2014, now Pat. No. 9,256,129.

(51) Int. Cl.
*G03F 7/20* (2006.01)
*G03F 7/12* (2006.01)
(Continued)

(52) U.S. Cl.
CPC .............. *G03F 7/12* (2013.01); *B05C 1/0834* (2013.01); *B05C 9/12* (2013.01); *G03F 7/168* (2013.01);
(Continued)

(58) Field of Classification Search
CPC ........... G03F 7/2022; G03F 7/20; G03F 7/202
See application file for complete search history.

(56) References Cited

U.S. PATENT DOCUMENTS 3,265,765 A   8/1966   Holden et al.
3,619,881 A   11/1971   Bills et al.
(Continued)

FOREIGN PATENT DOCUMENTS

EP   0456336   11/1991
EP   0640878   3/1995
(Continued)

*Primary Examiner* — Jennifer E Simmons
(74) *Attorney, Agent, or Firm* — Carmody Torrance Sandak & Hennessey LLP

(57) ABSTRACT

A method of making a relief image printing element from a photosensitive printing blank is described. The photosensitive printing blank comprises a laser ablatable mask layer disposed on at least one photocurable layer and the laser ablatable mask layer is selectively laser ablated to create an in situ mask and uncover portions of the at least one photocurable layer. The method includes a) pushing the photosensitive printing blank through a nip formed by a textured roller and a backing roller, wherein the textured roller contacts the in situ mask and the uncovered portions of the at least one photocurable layer; and b) exposing the at least one photocurable layer to at least one source of actinic radiation through the in situ mask to selectively cross link and cure the portions of the at least one photocurable layer not covered by the in situ mask. A defined topographical pattern is transferred from the textured surface of the roller to the at least one photocurable layer.

7 Claims, 1 Drawing Sheet

(51) Int. Cl.
  *B05C 1/08*     (2006.01)
  *B05C 9/12*     (2006.01)
  *G03F 7/16*     (2006.01)
(52) U.S. Cl.
  CPC ............ *G03F 7/202* (2013.01); *G03F 7/2022* (2013.01); *G03F 7/2055* (2013.01)

(56) References Cited

U.S. PATENT DOCUMENTS

| | | | |
|---|---|---|---|
| 3,867,153 | A | 2/1975 | MacLachlan |
| 3,891,443 | A * | 6/1975 | Halpern .................. B41N 3/04 101/170 |
| 4,264,705 | A | 4/1981 | Allen |
| 4,320,188 | A | 3/1982 | Heinz et al. |
| 4,323,636 | A | 4/1982 | Chen |
| 4,323,637 | A | 4/1982 | Chen et al. |
| 4,369,246 | A | 1/1983 | Chen et al. |
| 4,423,135 | A | 12/1983 | Chen et al. |
| 4,427,759 | A | 1/1984 | Gruetzmacher |
| 4,568,596 | A * | 2/1986 | Johnson .............. B29C 47/0021 204/168 |
| 4,622,088 | A | 11/1986 | Min |
| 4,789,447 | A | 12/1988 | Ahmed et al. |
| 5,055,375 | A | 10/1991 | Matsuo et al. |
| 5,135,827 | A | 8/1992 | Bohm et al. |
| 5,223,375 | A | 6/1993 | Berrier et al. |
| 5,262,275 | A | 11/1993 | Fan |
| 5,925,500 | A | 7/1999 | Yang |
| 5,927,189 | A * | 7/1999 | Jones ..................... B41J 11/002 101/23 |
| 6,238,837 | B1 | 5/2001 | Fan |
| 6,290,632 | B1 | 9/2001 | Blake et al. |
| 6,324,978 | B1 | 12/2001 | Kaulen et al. |
| 6,861,203 | B2 * | 3/2005 | Gelbart ...................... B41J 2/01 430/300 |
| 8,158,331 | B2 | 4/2012 | Recchia |
| 2006/0105109 | A1 * | 5/2006 | Gotsick .................. B41C 1/00 427/356 |
| 2010/0024672 | A1 * | 2/2010 | Vest .......................... G03F 7/40 430/306 |
| 2011/0079150 | A1 | 4/2011 | Wright et al. |
| 2011/0081614 | A1 | 4/2011 | Recchia |
| 2011/0115861 | A1 * | 5/2011 | Ready .................. B41J 11/0015 347/102 |
| 2012/0082932 | A1 * | 4/2012 | Battisti ..................... G03F 1/68 430/270.1 |
| 2012/0270156 | A1 | 10/2012 | Vest et al. |
| 2012/0274914 | A1 * | 11/2012 | Stowe ....................... B41F 7/00 355/53 |
| 2012/0286436 | A1 * | 11/2012 | Chen ................ B29D 11/00288 264/1.24 |
| 2013/0017493 | A1 | 1/2013 | Cook et al. |
| 2013/0040243 | A1 | 2/2013 | Gotsick et al. |
| 2013/0189625 | A1 | 7/2013 | Roshelli, Jr. et al. |
| 2013/0209939 | A1 * | 8/2013 | Recchia .................. G03F 7/092 430/296 |

FOREIGN PATENT DOCUMENTS

| | | |
|---|---|---|
| EP | 0465034 | 8/1996 |
| GB | 1366769 | 9/1974 |
| WO | 97/31783 | 9/1997 |
| WO | 2009016974 | 2/2009 |
| WO | 2012/152327 | 11/2012 |
| WO | 2015007667 | 1/2015 |

* cited by examiner

METHOD FOR CREATING SURFACE TEXTURE ON FLEXOGRAPHIC PRINTING ELEMENTS

CROSS REFERENCE TO RELATED APPLICATIONS

This application is a divisional of application Ser. No. 14/183,948, filed on Feb. 19, 2014, now pending, the subject matter of which is herein incorporated by reference in its entirety.

FIELD OF THE INVENTION

The present invention relates generally to a method for creating surface texture on flexographic relief image printing elements to improve print performance.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed solid (sheet) photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. One of the most widely used support layers is a flexible film of polyethylene terephthalate. The support sheet may optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) may include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material.

Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. One commonly used source of actinic radiation is a mercury arc lamp. Other sources of actinic radiation are also generally known to those skilled in the art.

The protective layer (or slip film) is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling, as described, for example in EP Pat. Pub. No. 0465034 to Nippon Paint Co., Ltd. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is typically a slip film which has been modified to include a radiation opaque material. Portions of the laser ablatable layer are ablated by exposing the masking layer to laser radiation at a selected wavelength and power of the laser. Examples of laser ablatable layers are described, for example, in U.S. Pat. No. 5,925,500 to Yang, et al., and U.S. Pat. Nos. 5,262,275 and 6,238,837 to Fan, the subject matter of each of which is herein incorporated by reference in its entirety. The plate and the in situ negative are then subjected to flood exposure by actinic radiation (e.g., UV light) through the in situ negative.

After imaging, the photosensitive printing element is processed (i.e., "developed") to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development.

The resulting surface has a relief pattern that reproduces the image to be printed. The relief pattern generally comprises a plurality of dots, and the shape of the dots and the depth of the relief, among other factors, affect the quality of the printed image. After the relief image is developed, the relief image printing element may be mounted on a press and printing commenced.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

The use of barrier layers in the flexographic printing plate manufacturing process is described in U.S. Pat. No. 8,158,331 to Recchia and in U.S. Pat. Pub. Nos. 2011/0079150, 2012/0270156 and 2012/0214102 all to Recchia, 2013/0017493 to Cook and 2013/0040243 to Gotsick, the subject matter of each of which is herein incorporated by reference in its entirety.

The use of barrier layers in the printing plate manufacturing process creates an advantageous relief image shape for flexographic relief image printing plates. One drawback to the use of the barrier layers is that while highly functional, the barrier layer (or membrane) is consumable, which adds to the cost of the printing plate.

Thus, there remains a need in the art for a simple and cost-effective means of texturing a photosensitive relief image printing element that overcomes the deficiencies of the prior art.

SUMMARY OF THE INVENTION

It is an object of the present invention to provide an improved process of providing surface roughness on the print surface of a relief image printing elements It is another object of the present invention to provide a low cost texturing method for texturing the print surface of the relief image printing element.

It is another object of the present invention to control the surface roughness of the print surface of a relief image printing element.

It is still another object of the present invention to provide a high throughput texturing method which can be implemented in a printing element manufacturing process.

It is still another object of the present invention to reduce the number of steps/apparatuses in a relief image printing element manufacturing process.

In one embodiment, the present invention relates generally to a method of making a relief image printing element from a photosensitive printing blank, said photosensitive printing blank comprising a laser ablatable mask layer disposed on at least one photocurable layer, wherein the laser ablatable mask layer is selectively laser ablated to create an in situ mask and uncover portions of the at least one photocurable layer, the method comprising the steps of:
  a) pushing the photosensitive printing blank through a nip formed by a textured roller and a backing roller, wherein the textured roller contacts the in situ mask and the uncovered portions of the at least one photocurable layer; and
  b) exposing the at least one photocurable layer to at least one source of actinic radiation through the in situ mask to selectively cross link and cure the portions of the at least one photocurable layer not covered by the in situ mask;

wherein a defined topographical pattern is transferred from the textured roller to at least the uncovered portions of the at least one photocurable layer.

The present invention also relates generally to an apparatus for transferring a defined topographical pattern into at least one photocurable layer of a photosensitive printing blank, wherein the relief image printing element comprises a laser ablatable mask layer disposed on the at least one photocurable layer, the laser ablatable mask layer having been selectively laser ablated to create an in situ mask and uncover portions of the at least one photocurable layer, the apparatus comprising:
  a plurality of rollers, said plurality of rollers comprising a textured roller and a backing roller spaced apart from the textured roller to form a nip therebetween for passage of the relief image printing element, wherein when the relief image printing element is pushed into and through the nip, the textured roller contacts the in situ mask and uncovered portions of the at least one photocurable layer, wherein a defined topographical pattern is transferred from the textured roller to at least the uncovered portions of the at least one photocurable layer.

BRIEF DESCRIPTION OF THE DRAWINGS

For a fuller understanding of the invention, reference is had to the following description taken in connection with the accompanying figures, in which.

Also, while not all elements may be labeled in each figure, all elements with the same reference number indicate similar or identical parts.

DETAILED DESCRIPTION OF THE PREFERRED EMBODIMENTS

Figure 1:
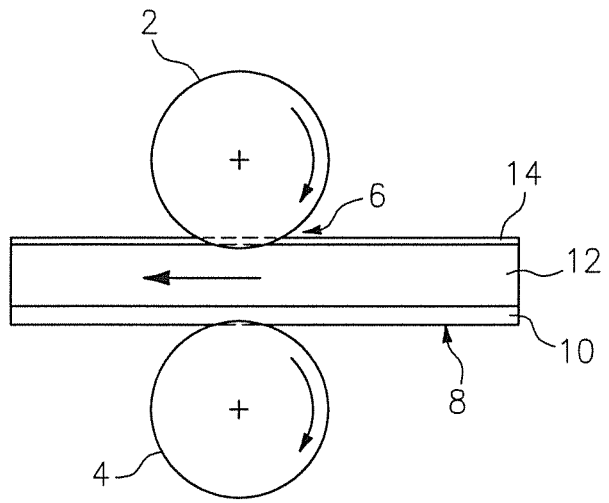
FIG. 1 depicts an apparatus in accordance with the present invention.

The present invention relates generally to method of making a relief image printing element from a photosensitive printing blank, said photosensitive printing blank comprising a laser ablatable mask layer disposed on at least one photocurable layer, wherein the laser ablatable mask layer is selectively laser ablated to create an in situ mask and uncover portions of the at least one photocurable layer, the method comprising the steps of:
  a) pushing the photosensitive printing blank through a nip formed by a textured roller and a backing roller, wherein the textured roller contacts the in situ mask and the uncovered portions of the at least one photocurable layer; and
  b) exposing the at least one photocurable layer to at least one source of actinic radiation through the in situ mask to selectively cross link and cure the portions of the at least one photocurable layer not covered by the in situ mask;

wherein a defined topographical pattern is transferred from the textured roller to at least the uncovered portions of the at least one photocurable layer.

The method described herein makes it possible to create texture on the surface of the at least one photocurable layer without the use of an intermediary membrane, complex photopolymer formulations and/or the imaging of screening patterns into the solid areas of the printing element. Thus, one of the main advantages of the invention is simplicity and cost-effectiveness. In the method described herein, a roller in direct contact with the surface of the at least one photocurable layer has a texture in it. This texture is imparted to the surface of the at least one photocurable layer through the application of the textured roller while the plate is pushed through the nip created by the textured roller and the backing roller. Heat and pressure may also be applied.

The photosensitive printing blank comprises a laser ablatable mask layer disposed on at least one photocurable layer. The at least one photocurable layer is disposed on a backing layer, which in one embodiment is a flexible film of polyethylene terephthalate. The laser ablatable mask layer generally comprises a slip film that has been modified to include a radiation opaque layer.

The laser ablatable mask layer is selectively ablated to remove portions of the laser ablatable mask layer and create an in situ negative by exposing the mask layer to laser radiation at a selected wavelength and power of the laser. Thus the laser will ablate portions of the laser ablatable mask layer corresponding to the desired image where the laser ablatable mask layer is ablated, the underlying photocurable layer will be uncovered and exposed. Thereafter, the photosensitive printing blank is pushed through the nip formed by the textured roller and the backing roller, whereby a defined topographical pattern is transferred from the textured roller to at least the uncovered portions of the at least one photocurable layer.

The nip created between the textured roller and the backing roller is adjusted to set the nip to a width that is less than the thickness of the photosensitive printing blank being processed. For example, the nip may be adjusted to a width that is less than about 95% of the total thickness of photosensitive printing blank, more preferably to set a width that is less than about 90% of the total thickness of the photosensitive printing blank. Because the photosensitive printing blank is compressible, it is capable of being compressed and pushed into and through the nip between the textured roller and the backing roller. Once the photosensitive printing blank has been pushed through the nip and has exited the nip, the photosensitive printing blank rebounds to its original thickness. The nip may be adjusted to accommodate different thicknesses of printing blanks.

In addition, the textured roller and the backing roller may be set to an appropriate temperature. In a preferred embodiment, the textured roller is maintained at an elevated temperature to heat the surface of the at least one photocurable layer, thus softening the at least one photocurable layer so that the textured roller can more easily imprint the texture into the at least one photocurable layer. In one embodiment, at least one of the rollers is heated to and maintained at a temperature of between about 15 to about 200° C., more preferably about 35 to about 150° C. and most preferably about 65 to about 125° C. while the photosensitive printing blank is being pushed through the nip between the textured roller and the backing roller. The backing roller may be maintained at an ambient or sub-ambient temperature (i.e. cooled).

The photosensitive printing blank is pushed through the nip between the textured roller and the backing roller at a rate that is slow enough to allow the texture of the textured roller to be imparted to the surface of the at least one photocurable layer as the textured roller rotates against the surface of the at least one photocurable layer. The speed of the photosensitive printing blank through the nip is preferably in the range of about 0.05 to about 2.0 meters/minute, more preferably about 0.10 to about 1.0 meters/minute.

Once the photosensitive printing blank has been pushed through the nip to impart a texture to the at least one photocurable layer, it is exposed to actinic radiation through the in situ mask to crosslink and cure portions of the at least one photocurable layer not covered by the in situ mask.

Thereafter, the imaged and exposed photosensitive printing blank is processed (or "developed") to reveal the relief image therein, said relief image comprising a plurality of relief printing dots. Development may be accomplished by various methods, including water development, solvent development and thermal development, by way of example and not limitation.

The textured roller comprises a texture on an outer surface thereof that may be regular or irregular in nature. The texturing roll is preferably a heat conductive metal or composite roller that has been textured to provide a matte or other desired finish thereon. By texturing the roller, submicron-sized craters, raised features, and/or indentations are created thereon and the negative image thereof can subsequently be transferred at least in part to the surface of the at least one photocurable layers. In addition, the texture imparted to the at least one photocurable layer of the photosensitive printing blank may be the same or different from the texture of the textured roller itself.

Various methods may be employed for texturing the surface of the textured roller. In one embodiment of the present invention, the textured roll comprises a matte finish and the texture of the matte finish may be transferred to the plate surface to provide a desired surface roughness on the surface of the printing plate.

For example, the surface of the textured roller may be provided with the appropriate texture by electron discharge texturing (EDT) which employs a plurality of arc generating electrodes spaced from the roll surface. The arcs provide a generally uniform roll surface of peaks and valleys of appropriate dimension. The dimensions are controlled by settings on the machine such as the voltage and current of the arcs and pulse length and pulse delay lines between arcs, rotation speed and traverse rates, etc., of the electrodes of the EDT machine relative to the roll surface. This process is described for example in U.S. Pat. Nos. 3,619,881 and 4,789,447, the subject matter of each of which is herein incorporated by reference in its entirety. Other texturing methods, including, for example, sand blasting the roll, laser beam texturing, and focused electron beam texturing. Any of these methods, among others, may be employed to achieve the desired roughness and peak count of the surface of the textured roller.

As depicted in FIG. 1, textured roller 2 is arranged opposite backing roller 4 to create a nip 6 therebetween through which the photosensitive printing blank 8 passes. The photosensitive printing blank 8 comprises a backing layer 10, one or more uncured photocurable layers 12 disposed on the backing layer 10, and a laser ablated mask layer 14 disposed on the one or more uncured photocurable layers 12. The textured roller 2 and the backing roller 4 are arranged so that the textured roller 2 contacts the one or more uncured photocurable layers and the backing roller 4 contacts the backing layer 10 as the photosensitive printing blank 8 is pushed or otherwise transported through nip 6. As the photosensitive printing blank 8 is pushed or otherwise travels through the nip 6, the textured roller 2 and opposing backing roller 4 rotate to impress the texture from the textured roller 2 into the at least one photocurable layer 12.

It is believed that a single pass through the nip 6 is sufficient to transfer the desired texture from the textured roller 2 to the at least one photocurable layer 12. However, if necessary, the photosensitive printing blank can be passed through the nip multiple times or more than one set of opposing rollers may be used.

The surface roughness achieved by use of the textured roller 2 described herein provide a desired texture on the surface of the at least one photocurable layer 12. Surface roughness of the at least one photocurable layer can be measured using a Veeco Optical Profilometer, model Wyko NT 3300 (Veeco Instruments, Plainville, N.Y.). The desired surface roughness is controlled to an acceptable value. For example, the average surface roughness must be sufficient to provide the desired benefits of improving the ink transfer properties of the resulting printing element, to yield smoother ink laydown and higher optical densities on the printed substrate. On the other hand, if the roughness of the texture is excessive, it can affect print quality by actually transferring the pattern to the surface being printed, resulting in qualitative print defects often described as mottling or pinholing, and the quantitative print defect of reduced solid ink density (SID). These defects generally degrade the quality of the printed articles made from plates with excessive roughness, reducing the vibrancy of colors and making it difficult to achieve consistent color reproduction.

Thus, while some degree of plate surface roughness can be beneficial to print performance, excessive surface roughness can have negative effect on print performance. The definition of "excessive" plate surface roughness varies depending upon various factors, including the substrate printed, the ink characteristics and the amount of ink used on each image. The inventors have found that plate surface roughness of less than about 2000 nm (Ra) is required to achieve good and uniform solid ink coverage, more preferably less than about 1200 nm and most preferably less than about 800 nm. At the lower end, the inventors have found that a surface of roughness of greater than about 50 nm, more preferably greater than about 100 nm and most preferably greater than about 300 nm is preferred.

The present invention also relates generally to an apparatus for transferring a defined topographical pattern onto at least one photocurable layer of a photosensitive printing blank, wherein the relief image printing element comprises a laser ablatable mask layer disposed on the at least one photocurable layer, the laser ablatable mask layer having been selectively laser ablated to create an in situ mask and uncover portions of the at least one photocurable layer, the apparatus comprising:

a plurality of rollers, said plurality of rollers comprising a textured roller and a backing roller spaced apart from the textured roller to form a nip therebetween for passage of the relief image printing element, wherein when the relief image printing element is pushed into and through the nip, the textured roller contacts the in situ mask and portions of the at least one photocurable layer, wherein a defined topographical pattern is transferred from the textured roller to at least the uncovered portions of the at least one photocurable layer.

Figure 2:
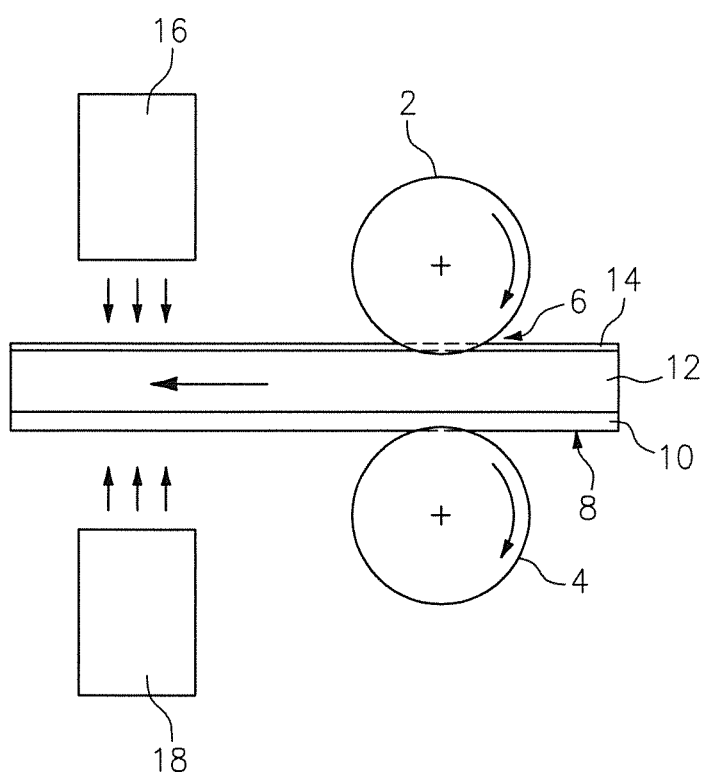
FIG. 2 depicts an apparatus in accordance with a second embodiment of the present invention.

As depicted in FIG. 2, the photosensitive printing blank 8 may be imaged directly after the texture from the texturing roller 2 has been transferred into the at least one photocurable layer 12. In this instance, a first source of actinic radiation 16 is mounted immediately after the textured roller 2 and the backing roller 4 and is positioned so that when the photosensitive printing blank 8 passes through the nip 6, the first source of actinic radiation 16 is capable of exposing a front side (i.e., printing side) of the photosensitive printing blank 8 to actinic radiation and such front exposure of the photosensitive printing blank 8 to actinic radiation may be performed immediately after the texturing step with the textured roller 2. In addition, if desired, a second source of actinic radiation 18 may be mounted immediately after the textured roller 2 and the backing roller 4 and is positioned so that when the photosensitive printing blank 8 passes through the nip 6, the second source of actinic radiation 18 is capable of exposing a back side of the photosensitive printing blank 8 through the backing layer 10 to actinic radiation to create a cured floor layer therein. This back exposure step may also be performed immediately after the texturing step with the textured roller 2. Thus, in this embodiment, the first source of actinic radiation 16 and the second source of actinic radiation 18 are an integral part of the texturing apparatus and thus enable the photosensitive printing element to be front exposed and/or back exposed immediately after the texturing step has occurred.

The use of this integral system creates a surface texture in the printing element that improves its print performance and also includes a front and/or back exposure of the photosensitive printing blank to actinic radiation that is performed as a serial step. Because this step occurs in a very short temporal distance from the texturing step, a separate step or steps of actinic radiation exposure are eliminated from manufacturing process. While prior methods are serial processes that involve separate apparatuses and require manual movement of the printing element after texturing, in this embodiment, a single apparatus is used to provide both texturing of the photosensitive printing blank and imagewise exposure of the photosensitive printing blank to actinic radiation.

Some of the benefits of using the combined apparatus for texturing and imagewise exposure of the photosensitive printing element include, but are not limited to, reduction in labor, improvements in exposure control, reduction in the space required to perform the steps of the manufacturing process and reduction in cost of equipment required to perform the steps involved.

What is claimed is:

1. An apparatus for making a relief image printing element from a photosensitive printing blank, the apparatus including a plurality of rollers for transferring a defined topographical pattern into at least one photocurable layer of the photosensitive printing blank, wherein the photosensitive printing blank comprises a backing layer, at least one uncured photocurable layer disposed on the backing layer, and a laser ablatable mask layer disposed on the at least one uncured photocurable layer, the laser ablatable mask layer having been selectively laser ablated to create an in situ mask and uncover portions of the at least one uncured photocurable layer, the plurality of rollers comprising:

a) a textured roller, said textured roller comprising a matte finish on an outer surface thereof, wherein the matte finish is transferrable to a surface of the at least one uncured photocurable layer to transfer a desired surface roughness to the surface of the at least one uncured photocurable layer, and b) a backing roller spaced apart from the textured roller configured to support the backing layer of the photosensitive printing blank while the surface of the at least one uncured photocurable layer is in contact with the textured roller and to facilitate transportation of the photosensitive printing blank through a nip formed between the textured roller and the backing roller and designed for passage of the photosensitive printing blank, wherein when the photosensitive printing blank is transported through the nip, the textured roller contacts the in-situ mask and the uncovered portions of the at least one uncured photocurable layer, wherein a defined topographical pattern is transferred from the textured surface of the roller to at least the uncovered portions of the at least one uncured photocurable layer; and a first source of actinic radiation that is capable of exposing the at least one uncured photocurable layer to actinic radiation through the in-situ mask to crosslink and cure portions of the at least one photocurable layer not covered by the in-situ mask, and a second source of actinic radiation arranged directly opposite the first source of actinic radiation on an opposite side of the photosensitive printing blank, wherein the first source of actinic radiation and the second source of actinic radiation are arranged immediately following the textured roller and the backing roller.

2. The apparatus according to claim 1, wherein the nip between the textured roller and the backing roller is adjusted to a width that is less than the thickness of the photosensitive printing blank being processed.

3. The apparatus according to claim 2, wherein the nip is set to a width that is less than about 95% of the total thickness of photosensitive printing blank.

4. The apparatus according to claim 3, wherein the nip is set to a width that is less than about 90% of the total thickness of the photosensitive printing blank.

5. The apparatus according to claim 1, wherein the textured roller is heated and the backing roller is maintained at ambient temperature.

6. The apparatus according to claim 1, wherein the textured roller is heated and the backing roller is maintained at a sub-ambient temperature.

7. The apparatus according to claim 1, wherein the textured roller comprises a heat conductive metal or composite roller that is textured to provide a matte finish thereon.

* * * * *